United States Patent [19]
Takano

[11] Patent Number: 5,996,098
[45] Date of Patent: Nov. 30, 1999

[54] MEMORY TESTER

[75] Inventor: Kazuo Takano, Saitama, Japan

[73] Assignee: Advantest Corporation, Tokyo, Japan

[21] Appl. No.: 09/077,397

[22] PCT Filed: Sep. 29, 1997

[86] PCT No.: PCT/JP97/03464

§ 371 Date: May 28, 1998

§ 102(e) Date: May 28, 1998

[87] PCT Pub. No.: WO98/14954

PCT Pub. Date: Apr. 9, 1998

[30] Foreign Application Priority Data

Sep. 30, 1996 [JP] Japan .................................. 8-258326

[51] Int. Cl.[6] .................................................. G01R 31/28
[52] U.S. Cl. .......................................... 714/723; 711/100
[58] Field of Search .................................... 714/718, 719,
714/723, 725, 763, 773, 819, 824, 42, 54;
364/245.3, 246.3, 966.4, 970.1, 970; 711/173,
100

[56] References Cited

U.S. PATENT DOCUMENTS 4,369,511  1/1983  Kimura et al. ........................... 714/719
5,357,473  10/1994  Mizuno et al. .......................... 365/201
5,909,448  6/1999  Takahashi ............................... 365/201

Primary Examiner—Trinh L. Tu
Attorney, Agent, or Firm—Gallagher & Lathrop; David N. Lathrop

[57] ABSTRACT

A circuit arrangement of a memory testing apparatus provided with a mask pattern memory is simplified. A mask pattern data read out of a mask pattern memory 111 is directly fed to a mask circuit 113 without converting the bit arrangement of the mask pattern data into a bit arrangement conforming to the arrangement of terminals of a memory under test 200. Temporary failure data having a bit arrangement corresponding to the arrangement of terminals of the memory under test is applied from a logical comparator 107 to a failure data selector 108 which controls the passage of a failure data the bit arrangement of which has been converted into a bit arrangement according to a given sequence of bit significance. Failure data having passed through the failure data selector is applied to the mask circuit which functions to mask writing of failure data in a failure analysis memory 109.

5 Claims, 3 Drawing Sheets

MEMORY TESTER

TECHNICAL FIELD

The present invention relates to a memory testing apparatus for testing a memory, for example, a memory called random access memory (hereinafter referred to as RAM) which is readable and writable, and more particularly, to an improvement in a memory testing apparatus provided with a mask pattern memory.

BACKGROUND ART

A memory testing apparatus for testing a memory such as RAM generally comprises a timing generator, a pattern generator, a waveform generator, a logical comparator and a failure analysis memory. As is well known, a memory of this kind is often constructed in the form of a semiconductor integrated circuit element. In the following discussion, a case will be described in which the memory testing apparatus tests a memory formed as a semiconductor integrated circuit element (hereinafter referred to as IC memory), by way of example, in order to facilitate understanding of the invention. However, it should be understood that the apparatus can also test memories other than IC memories.

A pattern generator generates, in response to a reference clock (operating clock) supplied from a timing generator, address pattern data, test pattern data, control signals and the like which are to be applied to an IC memory to be tested (IC memory under test), and in addition thereto, generates expected value pattern data and the like which are to be fed to a logical comparator.

An IC memory to be tested which is commonly called MUT (memory under test) is controlled in writing of a test pattern signal therein or reading of a test pattern signal therefrom by application of a control signal thereto. Specifically, when a writing control signal is applied to the IC memory under test, a test pattern signal is successively written in the IC memory under test at an address thereof specified by an address pattern signal, and when a reading control signal is applied to the IC memory under test, the test pattern signal previously written in the IC memory under test is successively read out thereof at an address specified by an address pattern signal.

A response output signal read out of the IC memory under test (hereinafter also referred to simply as memory under test) is supplied to the logical comparator where it is logically compared with an expected value pattern data outputted from the pattern generator. If a result of comparison in the logical comparator indicates an anti-coincidence or a mismatch, the logical comparator outputs a defective signal representing the anti-coincidence, namely, so-called failure data. The logical comparator usually outputs logical "1" having a high logical level (logic H) as a failure data. By contrast, if a result of comparison indicates a coincidence, the logical comparator outputs a defectless signal representing the coincidence, namely, so-called pass data. Since failure data is represented by logical "1", pass data is outputted as logical "0" having a low logical level (logic L). The failure data is fed to and stored in the failure analysis memory.

The failure analysis memory has the same operating rate or speed and storage capacity as those of the memory under test, and the same address pattern signal as that applied to the memory under test is applied to the failure analyses memory. In addition, the failure analysis memory is initialized prior to the start of a test. For example, when initialized, the failure analysis memory has data of logical "0s" written in all of the addresses thereof. Every time a failure data is generated from the logical comparator during a test of a memory under test, a failure data of logical "1" is written in the address of the failure analysis memory specified by the address pattern signal. That is, in a memory cell of the failure analysis memory having the same address as that of the failure memory cell of the memory under test is written the failure data (logical "1") indicating that failure memory cell of the memory under test.

Upon completion of one test cycle, a decision is rendered as to whether the memory under test is pass or failure in consideration of the number of failure data stored in the failure analysis memory, the locations where failure data occurred, and the like. By way of example, in case of utilizing the failure data stored in the failure analysis memory for purpose of relieving a defective memory cell of the memory under test, failure data read out of the failure analysis memory (information relating to the locations of defective memory cells of the memory under test) are totalled, and it is then determined based on the totalled failure data whether or not the locations of the detected failure memory cells can be relieved by relief means provided in the memory under test.

Owing to such reasons that the testing time duration can be reduced thereby improving an efficiency of test, the reliability of the test can be enhanced, the useful memory life can be prolonged, etc., it is preferred to arrange a failure analysis memory such that in the event a failure data is even once written in the failure analysis memory during a test in one mode, a failure data is prevented from being written again in the address or addresses in the failure analysis memory in which a failure data has been written during a subsequent test in a different mode. For this end, it is necessary to inhibit the failure data stored in the failure analysis memory from being updated. Usually, the failure analysis memory is arranged that the location of a memory cell in the failure analysis memory in which a failure data has been stored is masked. As a result, there is provided a second memory for masking the location of a memory cell in the failure analysis memory in which a failure data has been stored, together with the failure analysis memory. This second memory has the same storage capacity and bit width as those of the failure analysis memory, and is called a mask pattern memory in this technical field.

FIG. 3 schematically shows a conventional memory testing apparatus provided with a mask pattern memory. The memory testing apparatus 100 comprises a pattern generator 101, a timing generator 102, a waveform generator 104, a driver 105, an analog comparator 106, a logical comparator 107 and a failure analysis memory 109, and in addition thereto, comprises a pattern selector 103, a failure data selector 108, a mask pattern memory 111 and a mask pattern selector 112.

The timing generator 102 generates a reference clock (operating clock) which controls the operations of various parts or components. In response to the reference clock fed from the timing generator 102, the pattern generator 101 generates a memory test pattern data in a given bit sequence (from MSB to LSB, for instance). The memory test pattern data comprises address pattern data, test pattern data, expected value pattern data and the like all of which are generated in the given bit sequence (from MSB to LSB). Such data are fed to the pattern selector 103 where they are converted into pattern data having an arrangement (array) of bits (from P1 to PN, for instance) which corresponds to an arrangement (array) of terminals of an IC memory 200 under test.

The pattern data from the pattern selector 103 are supplied to the waveform generator 104 where pattern signals each having a real waveform depending upon the pattern data are produced. The pattern signals outputted from the waveform generator 104 are fed through the driver 105 to individual terminals of the IC memory 200 under test for testing it.

A response output signal read out of the memory 200 is supplied to the analog comparator 106 which determines whether or not the logic level of the response output signal has a given voltage level. A data resulting from the comparison in the analog comparator 106 is inputted to the logical comparator 107 to which an expected value pattern data supplied from the corresponding pattern selector 103 is also applied and the logical comparator 107 determines whether both the data are coincident with each other or not.

Every time both the data are not coincident with each other, a failure data outputted from the logical comparator 107 is fed to the failure data selector 108 which in turn converts the arrangement of the failure data from the bit arrangement (from P1 to PN) corresponding to the arrangement of the terminals of the memory 200 back to the bit arrangement (from MSB to LSB) having the sequence of the original bit significance. Then the failure data having the original bit arrangement are fed to the failure analysis memory 109 in which the failure data are stored in memory cells thereof at address positions specified by the address pattern data directly fed from the pattern generator 101, respectively. That is, in a memory cell of the failure analysis memory 109 at the same address as that of a failure memory cell of the IC memory 200 under test is written each of the failure data (logical "1") indicating that failure memory cell of the IC memory 200.

As described above, the mask pattern memory 111 has the same storage capacity and bit width as those of a memory under test, and stores a data indicating an address of a failure memory cell (address to be masked) in the memory 200 under test which has occurred during a test in one mode in a memory cell of the mask pattern memory 111 having the same address as that of the failure memory cell of the memory 200. When a subsequent test is carried out in a different mode, a mask address data for a failure memory cell stored in the mask pattern memory 111 is read out as a mask pattern data by that an address pattern data is supplied from the pattern generator 101 to the mask pattern memory 111.

The mask pattern data read out of the mask pattern memory 111 is fed to the mask pattern selector 112 in which the bit arrangement of the mask pattern data is converted from the bit arrangement (from MSB to LSB) having the sequence of a given bit significance into comparison mask pattern data having the bit arrangement (from P1 to PN) corresponding to the arrangement of the terminals of the memory 200 under test. Thereafter, the comparison mask pattern data are fed to the logical comparator 107. As mentioned above, the logical comparator 107 performs a logical comparison between a response output signal read out from the corresponding one of the terminals of the memory 200 under test and an expected value pattern data from the pattern selector 103. However, when a comparison mask pattern data is supplied to the logical comparator 107, the logical comparator 107 is controlled so as not to perform a logical comparison between a response output signal from the corresponding one of the terminals of the memory 200 and an expected value pattern data so far as an address specified by such comparison mask pattern data is concerned. As a result, the logical comparator 107 does not output any failure data with regard to the address specified by each of the comparison mask pattern data. Accordingly, a failure data stored in the failure analysis memory 109 at the address corresponding to the address specified by a comparison mask pattern data is not updated.

In the memory testing apparatus 100 provided with the conventional mask pattern memory 111, the mask operation is achieved by supplying a comparison mask pattern data to the logical comparator 107. This requires that the mask pattern data read out of the mask pattern memory 111 should be fed to the mask pattern selector 112 thereby converting the bit arrangement of such mask pattern data from the bit arrangement (from MSB to LSB) having the sequence of a given bit significance to the bit arrangement (from P1 to PN) corresponding to the arrangement of the terminals of the memory 200 under test.

The mask pattern selector 112 must be capable of selecting any one of bit arrangements corresponding to terminal arrangements of memories under test of various standards, resulting in its circuit arrangement or construction of a large scale. Consequently, there occur disadvantages that the overall construction of the memory testing apparatus also becomes a large scale and the manufacturing cost is increased.

In particular, a recent trend is toward increasing the number of terminals of a memory under test and the number of bits is also increased, resulting in disadvantages that the circuit arrangement of the mask pattern selector 112 is larger in scale more and more, the overall construction of the memory testing apparatus is bigger and its manufacturing cost is increased more and more.

DISCLOSURE OF THE INVENTION

It is an object of the present invention to provide a memory testing apparatus which allows the execution of a mask operation without use of a mask pattern selector and hence provided with a mask pattern memory simplified in its construction.

In accordance with the present invention, the above object is accomplished by providing a memory testing apparatus comprising: a pattern generator for outputting at least address pattern data and test pattern data each having a bit arrangement according to a given sequence of bit significance; a pattern selector for converting the bit arrangement of each of the address pattern data and the test pattern data into a second bit arrangement conforming to the arrangement of terminals of a memory under test; a waveform generator for converting the address pattern data and the test pattern data converted in bit arrangement by the pattern selector into an address pattern signal and a test pattern signal respectively each of which has a real waveform; means for applying the address pattern signal and the test pattern signal outputted from the waveform generator to the memory under test; a logical comparator for performing a logical comparison between a response output signal read out from the memory under test and an expected value pattern data outputted from the pattern generator; a failure data selector for converting the bit arrangement of failure data outputted from the logical comparator from the bit arrangement conforming to the arrangement of terminals of the memory under test back to the bit arrangement according to the given sequence of bit significance; a failure analysis memory having the same address area as that of the memory under test and storing a failure data outputted from the logical comparator at the same address as that of a memory cell in the memory under test in which a failure has occurred; a mask memory having the same address area as that of the memory under test and storing a mask data in a memory cell thereof having the same address as that of a memory cell in the failure analysis memory in which a failure data has been stored, the mask data being used for masking a further failure data; and a mask circuit, in response to a mask data read out of the mask memory, for inhibiting a failure data supplied from the failure data selector to the failure analysis memory from passing through the mask circuit, the failure data having the same address as that of the mask data among other failure data supplied from the failure data selector to the failure analysis memory.

That is, the present invention is characterized in that the mask circuit is directly controlled by the mask data read out of the mask memory, thereby to control the passage of a failure data which is to be written in the failure analysis memory to perform a masking operation.

In a preferred embodiment, the memory testing apparatus further comprises an analog comparator for determining whether or not the logical value of a response output signal read out of the memory under test has a given voltage level, and data resulting from the analog comparison in the analog comparator is fed to the logical comparator.

In addition, an expected value pattern data outputted from the pattern generator is converted in its bit arrangement into the bit arrangement conforming to the bit arrangement of terminals of the memory under test by the pattern selector, and thereafter the expected value pattern data having the bit arrangement conforming to the bit arrangement of terminals of the memory under test is fed to the logic comparator where it is logically compared with a response output signal read out from the memory under test.

With the arrangement described above, no masking operation takes place in the logical comparator, and accordingly, all of results of comparison are outputted from the logical comparator as temporary failure data. The temporary failure data is then fed to the failure data selector where it is converted back into the bit arrangement according to the original sequence of bit significance before it is applied to the mask circuit Accordingly, mask data read out of the mask memory can be directly used as a control signal in a masking operation. In this manner, a mask pattern selector having an increased scale of circuit construction which has been essential in the conventional construction is entirely unnecessary, allowing the overall construction of the memory testing apparatus to be simplified and provided inexpensively.

BEST MODE OF CARRYING OUT THE INVENTION

Now an embodiment of the present invention will be described in detail with reference to FIGS. 1 and 2.

Figure 1:
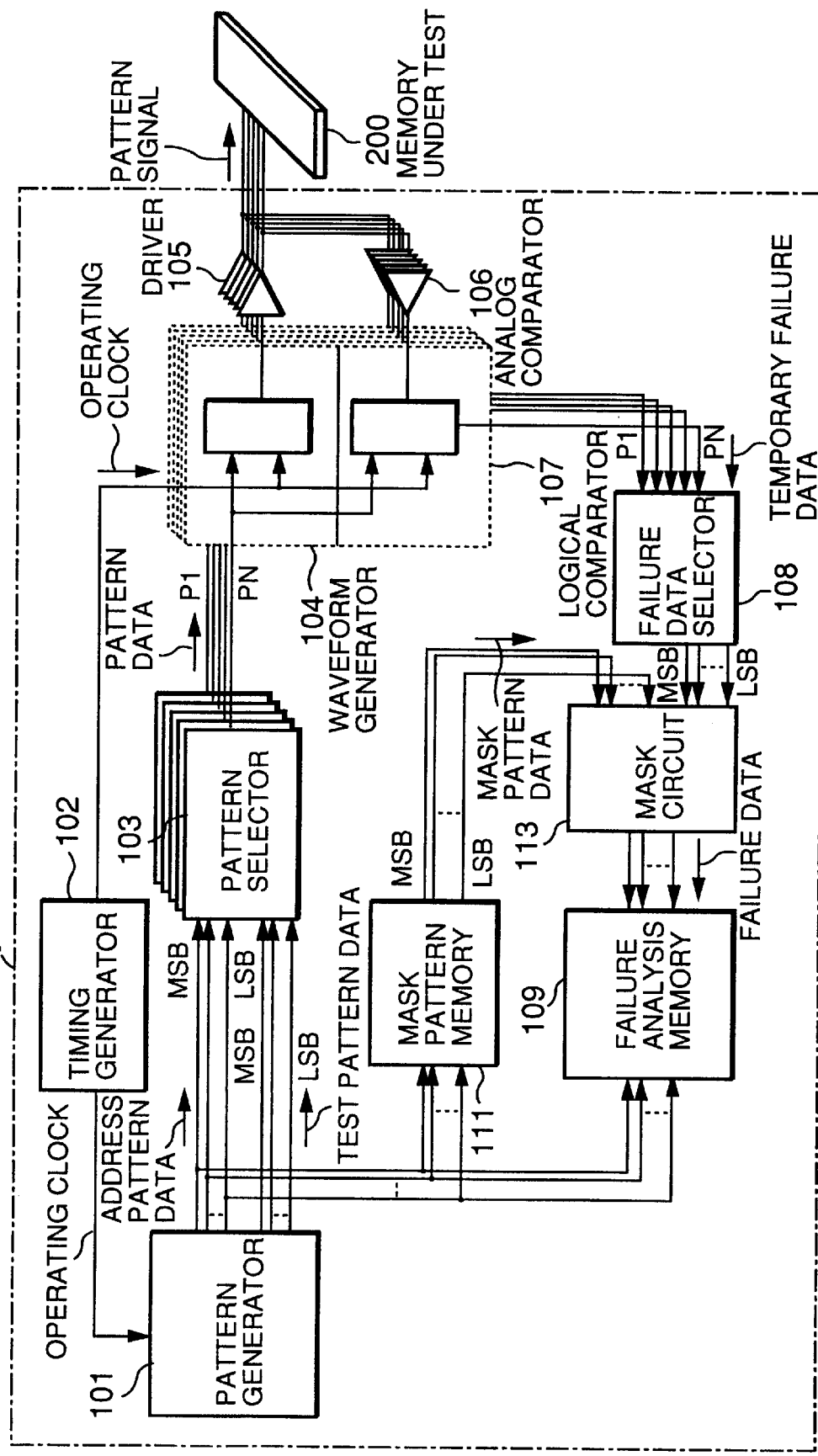
FIG. 1 is a block diagram schematically illustrating the construction of an embodiment of the memory testing apparatus according to the present invention.
Figure 3:
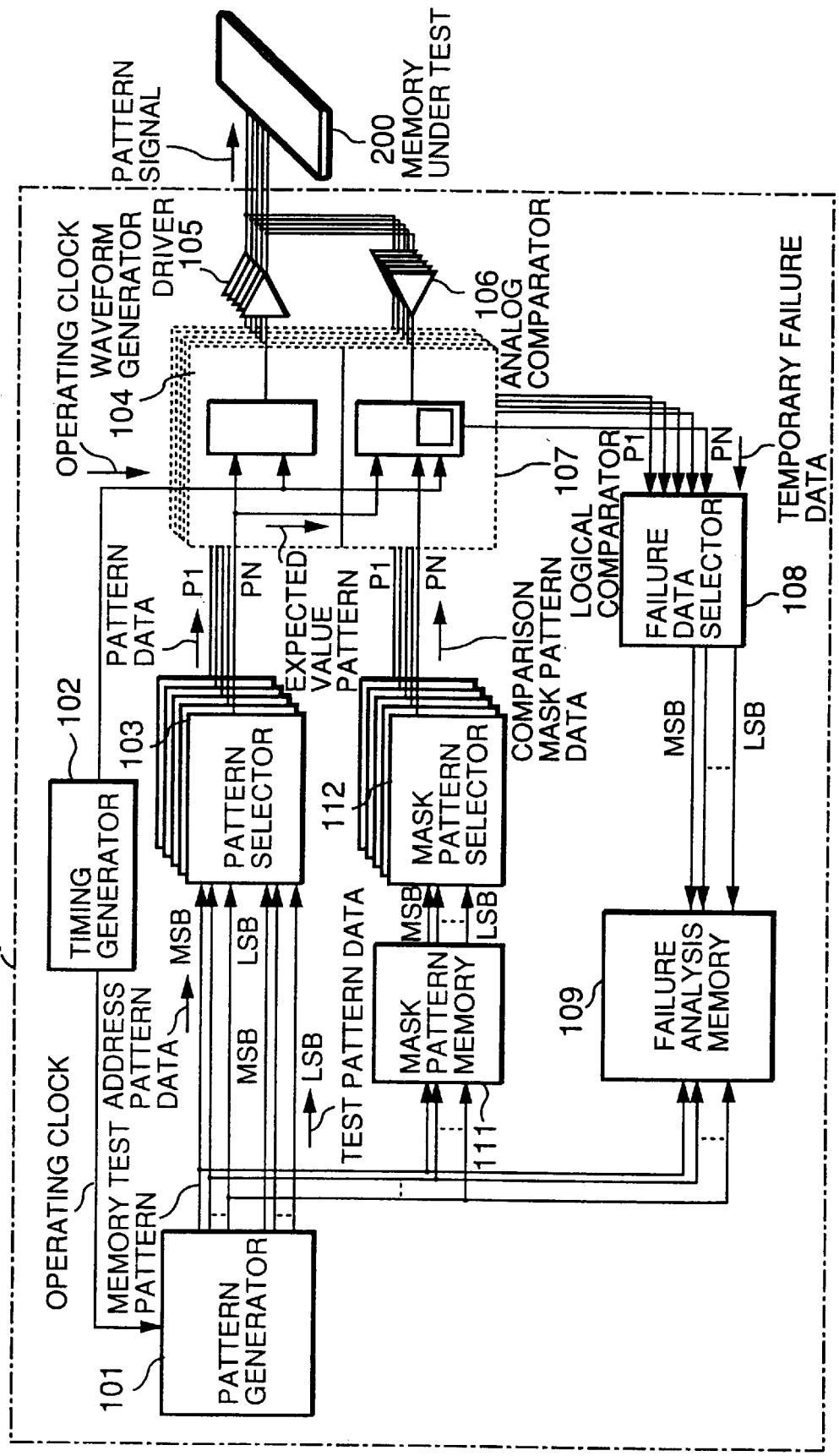
FIG. 3 is a block diagram showing a conventional memory testing apparatus provided with a mask pattern memory.

FIG. 1 is a block diagram schematically illustrating the construction or arrangement of an embodiment of the memory testing apparatus according to the present invention. In FIG. 1, elements, circuits and the like corresponding to those in the memory testing apparatus shown in FIG. 3 are designated by the same characters, and the explanation thereof will be omitted unless necessary.

In this embodiment, between a failure analysis memory 109 and a failure data selector 108 is interposed a mask circuit 113 having one input terminal to which a mask pattern data read out of a mask pattern memory 111 is directly inputted. To the other input terminal of the mask circuit 113 is inputted a temporary failure data outputted from the failure data selector 108.

Figure 2:
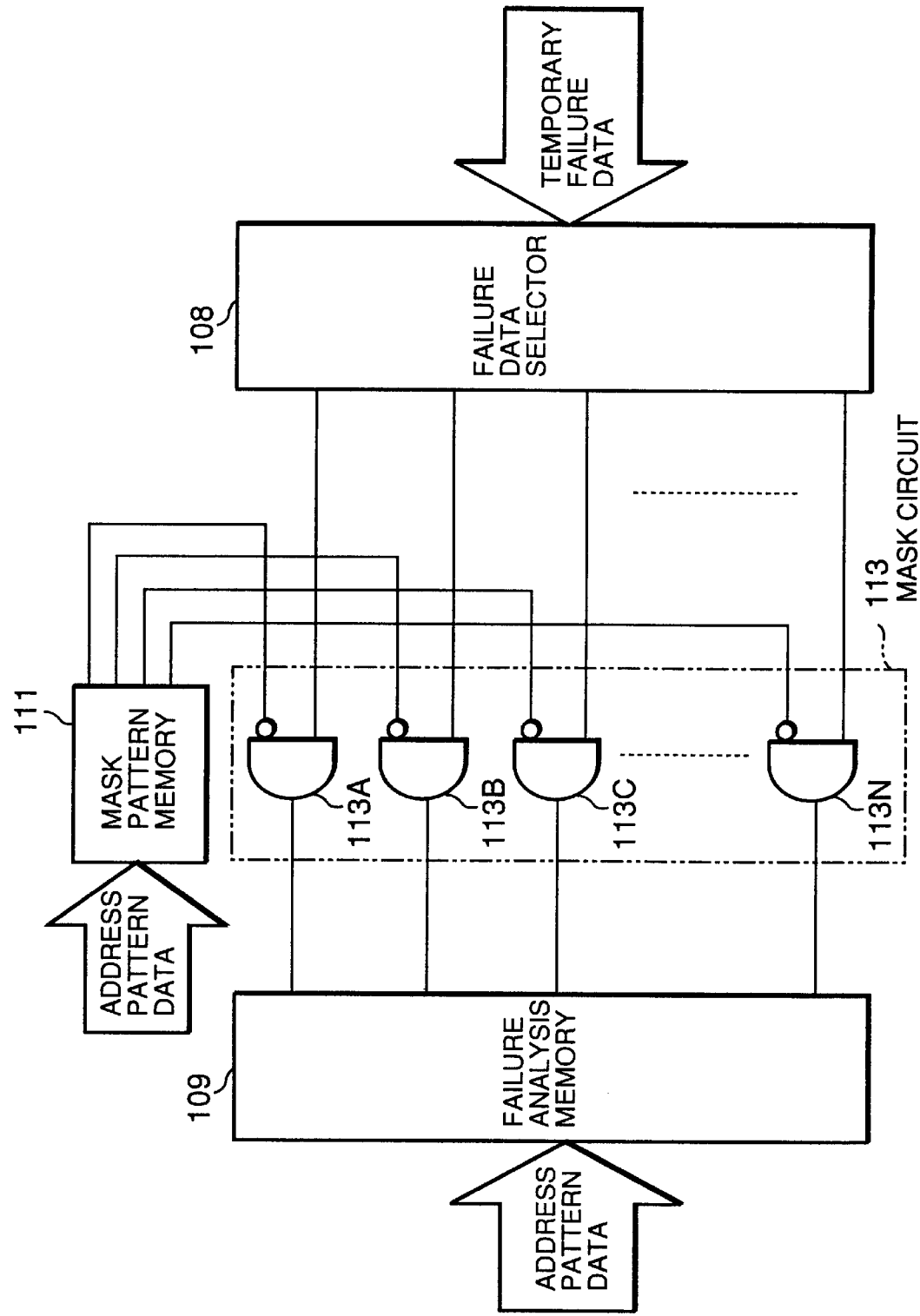
FIG. 2 is a block diagram showing a specific example of the circuit arrangement of the principal part of the memory testing apparatus shown in FIG. 1.

A specific example of the mask circuit 113 is shown in FIG. 2. As shown, the mask circuit 113 may comprise a plurality of AND gates 113A–113N the number of which are equal to the number of bits of a mask pattern data read out of the mask pattern memory 111 and of a temporary failure data outputted from the failure data selector 108. Each of the AND gates 113A–113N has a pair of input terminals, one of which is an inverting input terminal to which a corresponding bit in a mask pattern data read out of the mask pattern memory 111 is fed.

As already discussed, the mask pattern memory 111 has the same storage capacity and bit width as those of a memory under test 200, and stores a data indicating the address of a failure memory cell (an address to be masked) in the memory under test 200 which has occurred during a test in one mode in a memory cell in the memory 111 having the same address as that of the failure memory cell. When a subsequent test in a different mode is conducted, as address pattern data from a pattern generator 101 is fed to the mask pattern memory 111, stored data representing the mask address for the failure memory cell is read out as mask pattern data.

Assuming that the mask address data which is written into the mask pattern memory 111 is represented by logical "1" (logic H), for example, the bit of the mask pattern data which is read out when the mask address data is accessed assumes logic H. Since the logic H bits in the mask pattern data are fed to the inverting input terminals of corresponding ones of the AND gates 113A–113N, only those of AND gates 113A–113N which are supplied with mask address data will be closed.

Accordingly, the temporary failure data which is supplied to the other input terminal of each of those AND gates 113A–113N to which the logic H is applied cannot pass the AND gates. Accordingly, new failure data cannot be written into a memory cell in the failure analyses memory 109 located at an address where the failure data is stored. In this manner, an updating of failure data which is stored in the failure analyses memory 109 can be inhibited.

As described above, according to the preferred embodiment of the present invention, the temporary failure data having bit positions which are defined according to the sequence in which the array of terminals on the memory under test 200 is ordered is converted into the array of bit positions used in the address pattern data and the test pattern data outputted from the pattern generator 101 in the failure data selector 108. The temporary failure data which has been subject to such conversion in the array of bit positions is fed to the mask circuit 113, causing a mask pattern data which is read out from the mask pattern memory 111 to mask failure data. In this manner, a mask pattern selector 112 which has been essential in the prior art arrangement is dispensed with.

Since there is no need to use a mask pattern selector having an increased scale of circuit arrangement, the overall arrangement of the memory testing apparatus 100 can be simplified, advantageously allowing a deduction in the size of the apparatus and in its manufacturing cost.

While the above embodiment has been described in terms of testing an IC memory, it should be understood that the memory testing apparatus according to the present invention can be used also in testing memories other than IC memories with similar effect.

What is claimed is:

1. A memory testing apparatus comprising:
   a pattern generator for outputting at least address pattern data and test pattern data each having a bit arrangement according to a given sequence of bit significance;
   a pattern selector for converting the bit arrangement of each of the address pattern data and the test pattern data into a second bit arrangement conforming to the arrangement of terminals of a memory under test;
   a waveform generator for converting the address pattern data and the test pattern data converted in bit arrangement by said pattern selector into an address pattern signal and a test pattern signal respectively each of which has a real waveform;
   means for applying the address pattern signal and the test pattern signal outputted from said waveform generator to the memory under test;
   a logical comparator for performing a logical comparison between a response output signal read out from the memory under test and an expected value pattern data outputted from said pattern generator;
   a failure data selector for converting the bit arrangement of failure data outputted from said logical comparator from the bit arrangement conforming to the arrangement of terminals of the memory under test back to the bit arrangement according to the given sequence of bit significance;
   a failure analysis memory having the same address area as that of the memory under test and storing a failure data outputted from said logical comparator at the same address as that of a memory cell in the memory under test in which a failure has occurred;
   a mask memory having the same address area as that of the memory under test and storing a mask data in a memory cell thereof having the same address as that of a memory cell in said failure analysis memory in which a failure data has been stored, said mask data being used for masking a further failure data; and
   a mask circuit, in response to a mask data read out of said mask memory, for inhibiting a failure data supplied from said failure data selector to said failure analysis memory from passing through said mask circuit, said failure data having the same address as that of the mask data among other failure data supplied from said failure data selector to said failure analysis memory.

2. The memory testing apparatus according to claim 1, further comprising an analog comparator for determining whether or not the logical value of a response output signal read out of the memory under test has a given voltage level, and data resulting from the analog comparison in said analog comparator is fed to said logical comparator.

3. The memory testing apparatus according to claim 1, wherein an expected value pattern data outputted from said pattern generator is converted in its bit arrangement into the bit arrangement conforming to the bit arrangement of terminals of the memory under test by said pattern selector, and thereafter the expected value pattern data having the bit arrangement conforming to the bit arrangement of terminals of the memory under test is fed to said logic comparator where it is logically compared with a response output signal read out from the memory under test.

4. The memory testing apparatus according to claim 1, wherein said mask memory has the same storage capacity and bit width as those of the memory under test, and stores data indicating the address of a failure memory cell in the memory under test which has occurred during a test in one mode at the same address of said mask memory as the address of that failure memory cell in the memory under test.

5. The memory testing apparatus according to claim 1, wherein said mask circuit is constituted by a plurality of AND gates the number of which are equal to the number of bits of a mask data read out of said mask memory and of a failure data outputted from said failure data selector, and one input terminal of each of said AND gates is a polarity inverting input terminal to which a corresponding bit of a mask data read out of the mask memory is fed.

* * * * *